US008131531B2

(12) United States Patent  
Goldsmith

(10) Patent No.: US 8,131,531 B2
(45) Date of Patent: Mar. 6, 2012

(54) SYSTEM AND METHOD FOR SIMULATING A SEMICONDUCTOR WAFER PROBER AND A CLASS MEMORY TEST HANDLER

(75) Inventor: Larry Ira Goldsmith, Soquel, CA (US)

(73) Assignee: Verigy (Singapore) Pte. Ltd., Singapore (SG)

( * ) Notice: Subject to any disclaimer, the term of this patent is extended or adjusted under 35 U.S.C. 154(b) by 880 days.

(21) Appl. No.: 11/998,481

(22) Filed: Nov. 30, 2007

(65) Prior Publication Data

US 2009/0144041 A1    Jun. 4, 2009

(51) Int. Cl.
- *G06F 9/44* (2006.01)
- *G06F 13/10* (2006.01)
- *G06F 13/12* (2006.01)

(52) U.S. Cl. .......................................................... 703/21

(58) Field of Classification Search .................... 703/21, 703/24; 716/4, 6, 25; 700/121, 39, 40; 714/25
See application file for complete search history.

(56) References Cited

U.S. PATENT DOCUMENTS

| | | | | | |
|---|---|---|---|---|---|
| 5,355,320 | A | * | 10/1994 | Erjavic et al. | 716/4 |
| 5,568,408 | A | * | 10/1996 | Maeda | 702/117 |
| 5,621,652 | A | * | 4/1997 | Eakin | 716/5 |
| 6,128,403 | A | * | 10/2000 | Ozaki | 382/145 |
| 6,505,138 | B1 | * | 1/2003 | Leonard | 702/119 |
| 6,769,100 | B2 | * | 7/2004 | Acar et al. | 716/4 |
| 6,795,800 | B1 | * | 9/2004 | Lee | 703/2 |
| 7,123,040 | B2 | * | 10/2006 | Yang et al. | 324/765 |
| 2005/0229063 | A1 | * | 10/2005 | Iizuka | 714/738 |
| 2005/0231222 | A1 | * | 10/2005 | DiOrio et al. | 324/754 |

* cited by examiner

*Primary Examiner* — Paul Rodriguez
*Assistant Examiner* — Bernard E Cothran
(74) *Attorney, Agent, or Firm* — Holland & Hart, LLP

(57) ABSTRACT

A method runs a simulation. The method comprises receiving a selection of a device. The device is one of a prober used in wafer testing and a handler used in package testing. The method comprises receiving at least one parameter for a set of parameters for the simulation. The method comprises running the simulation by executing commands to be performed as if the device were present. A controller supplies the set of commands. Results from the simulation indicate a performance of the controller.

22 Claims, 5 Drawing Sheets

Communications

Serial Parameters

| | |
|---|---|
| Port | COM1 ▼ |
| Baud Rate | 3600 Baud ▼ |
| Data bits | 8 Data Bits ▼ |
| Parity | Even Parity ▼ |
| Stop bits | 1 Stop Bit ▼ |

GPIB Parameters

| | |
|---|---|
| Primary Address: | COM1 |
| Port | GPIB0 ▼ |

Fig. 4

Logging

☑ Logging Activated     [Display Log File...]

☐ Automatic Log Append

Current Log File:
SIM.LOG

Fig. 5

SYSTEM AND METHOD FOR SIMULATING A SEMICONDUCTOR WAFER PROBER AND A CLASS MEMORY TEST HANDLER

BACKGROUND

Certain hardware is used to determine whether software to test semiconductor flash memory wafer testing and semiconductor flash memory package testing is performing properly. In particular, the hardware may include wafer probers and package handlers. A wafer prober is a machine to test integrated circuits. The wafer prober is usually responsible for loading and unloading a wafer from its carrier or cassette and is equipped with automatic pattern recognition optics capable of aligning the wafer with sufficient accuracy to ensure accurate registration between the contact pads on the wafer and the tips of the probe. Package handlers perform a substantially similar functionality. Therefore, by connecting a controller with installed software to the wafer prober and/or the package handler, the wafer prober and/or package handler may execute the functionality dictated by the software. The software may also be modified to test if the hardware runs according to predetermined parameters.

However, wafer probers and package handlers are very expensive and not readily available at customer sites. Even when a wafer prober or package handler is available, upgraded models of the wafer prober or package handler may be necessary for testing purposes, facilitating a need to purchase the upgraded models. Prober manufacturers often have simulator software for its respective prober but the manufacturers often do not make the simulator available to outside testers. Furthermore, because the simulator software is designed specifically for the respective prober of the manufacturer, the simulator software does not cover the range of available probers and/or handlers that is required to be supported. That is, a different simulator is necessary to test a performance of the software for each prober/handler.

SUMMARY OF THE INVENTION

The present invention relates to a method for running a simulation. The method comprises receiving a selection of a device. The device is one of a prober used in wafer testing and a handler used in package testing. The method comprises receiving at least one parameter for a set of parameters for the simulation. The method comprises running the simulation by executing commands to be performed as if the device were present. A controller supplies the set of commands. Results from the simulation indicate a performance of the controller.

DESCRIPTION OF THE DRAWINGS

FIG. 4 shows a second user interface for the testing system of FIG. 1 according to an exemplary embodiment of the present invention.

FIG. 5 shows a third user interface for the testing system of FIG. 1 according to an exemplary embodiment of the present invention.

DETAILED DESCRIPTION

Figure 1:
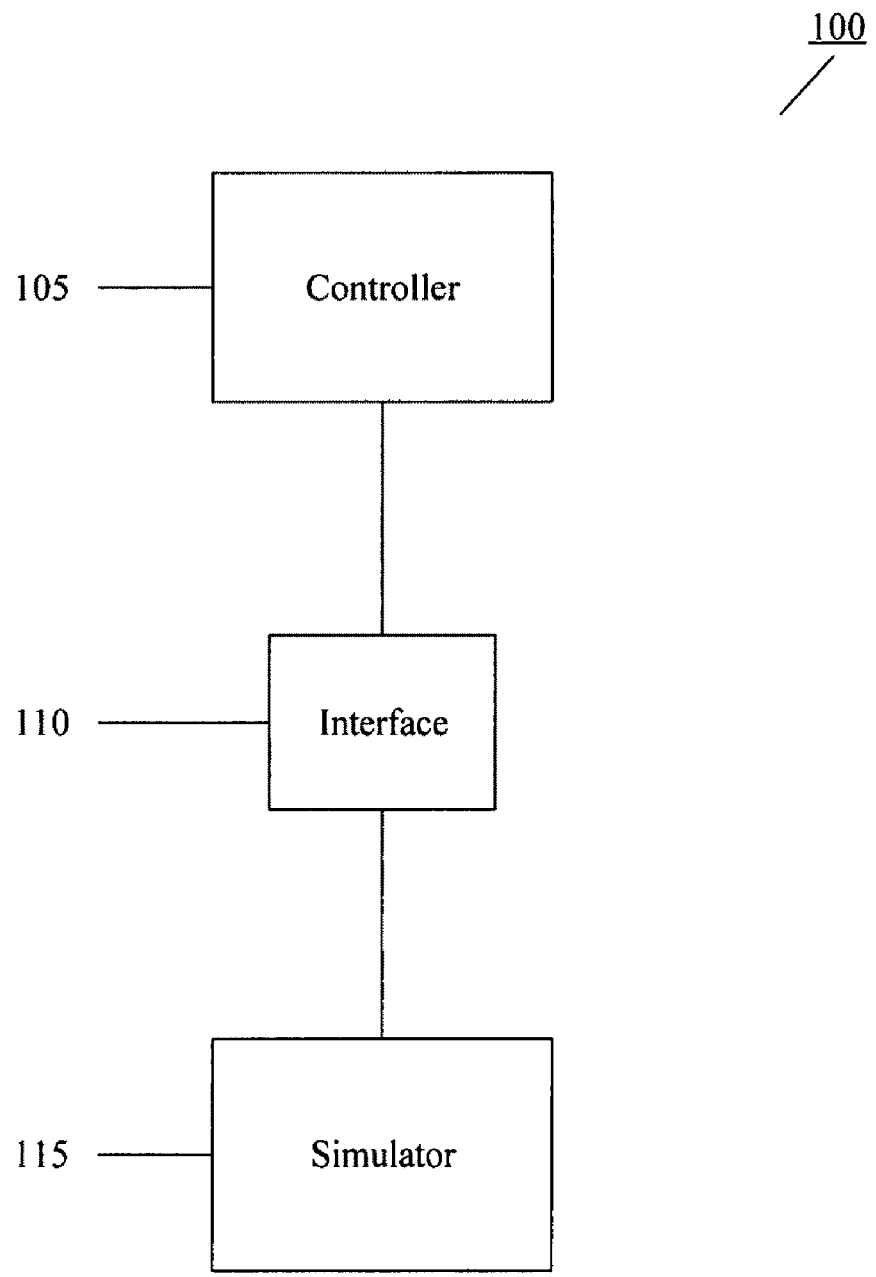
FIG. 1 shows a testing system according to an exemplary embodiment of the present invention.

The exemplary embodiments of the present invention may be further understood with reference to the following description and the appended drawings, wherein like elements are referred to with the same reference numerals. The exemplary embodiments of the present invention provide a system and associated method for performing a simulated test for semiconductor flash memory wafer testing and semiconductor flash memory package testing without requiring a physical wafer prober and/or package handler. Furthermore, the system and method are configured to simulate any wafer prober and/or package handler for the simulated test. Thus, the system enables a tester to perform different tests on the software using a wide variety of wafer probers and/or package handlers. The simulated test, the wafer prober, and the package handler will be described in detail below.

Various problems are encountered during software development and field support when verifying the operation of software for determining performance of semiconductor flash memory wafer testing and semiconductor flash memory package testing. In particular, the software may be designed for use with hardware such as wafer probers or final test handlers. This hardware may be unavailable to run the test for the software. The exemplary embodiments of the present invention are directed toward a simulator that acts as if the wafer prober and/or the final test handler is physically available so that commands may be received from a controller that includes the software and implemented on the simulated wafer prober and/or final test handler. Therefore, the simulator may take input and respond exactly as the physical hardware would respond.

FIG. 1 shows a testing system 100 according to an exemplary embodiment of the present invention. The testing system 100 may be used to determine performance parameters for a software designed to control wafer probers and/or final test handlers in semiconductor flash memory wafer testing and/or semiconductor flash memory package testing. The testing system 100 may include a controller 105, an interface 110, and a simulator 115.

The controller 105 may include the software configured to test the performance of semiconductor flash memory wafer testing and semiconductor flash memory package testing. The controller 105 may transmit input signals to a wafer prober and/or final test handler so that the wafer prober and/or final test handler performs a certain functionality relating to a wafer. For example, the input signals may indicate how the wafer prober is to be positioned so that the contact pads of the wafer couple to the tips of the prober. Because the controller 105 includes the software and controls the wafer prober and/or final test handler, according to the exemplary embodiments of the present invention, the controller 105 is a device under test for determining whether the software installed thereon is operating within predetermined parameters, whether the controller 105 includes a malfunctioning component, etc.

The simulator 115 may be a program stored on a memory and executed on a processor of a computing device. According to the exemplary embodiments of the present invention, the simulator 115 may be embodied on a laptop computer. The laptop may be portable to enable a tester to utilize the simulator 115 in field support matters. The laptop may be attached or coupled through wired or wireless means to the controller 105. It should be noted that the use of the laptop is only exemplary. The simulator 115 may be embodied on any computing device, even non-portable ones. For example, when the simulations are run at customer sites, portability may be unnecessary. Thus, the simulator 115 may be embodied in a desktop computer. In another example, another portable device such as a mobile device that is designed specifically to run the simulator 115 may be used. The mobile device may be better suited for the field support matters as the mobile device is often smaller and easier to carry.

The interface 110 may be another component of the testing system 100 to aid in simulating the wafer prober and/or the final package handler. Because the exemplary embodiments of the testing system 100 enable different wafer probers and/or final package handlers to be simulated and because there are a plurality of different wafer probers and/or final package handlers where each wafer prober and final package handler connects to the controller 105 using a different interface, the interface 110 provides a corresponding connection of the simulator 115 to the controller 105, thereby enabling a simulation that is as close to a test with using the physical wafer prober and/or final package handler. It should be noted that the interface 110 being disposed as a separate unit is only exemplary. The interface 110 may be part of the simulator 115 as the different interfaces provided by the interface 110 may be a respective device driver to simulate the different interfaces. Further interfaces may be added through an addition of another device driver. The different types of interfaces 110 will be discussed in detail below.

According to the exemplary embodiments of the present invention, the simulator 115 enables a plurality of different wafer probers and/or package handlers to be simulated. For example, the simulated wafer probers may include all variations of an EP prober, a TSK prober, a TEL prober, etc. The simulated package handler may be an Advantest final test handler. As will be described in detail below, the simulator 115 may provide full control of the configuration of the simulation; provide full logging capability; and provide non-error simulations as well as error simulations. The simulator 115 may also enable a tester to perform a full regression testing in preparation for a new software release.

The simulator 115 enables a tester to specify which device is to be simulated and parameters of the simulation. As will be described in detail below, some parts of the simulation are code driven while other parts of the simulation are file driven. Upon specifying the device and the parameters, the simulator 115 may respond to any traffic (e.g., input signals) from the controller 105 as if the specified device were physically present. The interface 110 is configured to further simulate the specified device. As discussed above, the different devices may connect to the controller 105 in different manners. The interface 110 may provide the different manners in which the devices would connect to the controller 105. For example, the interface 110 may be a GP-IB (general purpose interface bus) protocol, a serial connection, a local area network communications (LAN) device, etc. Specifically, the EG probers and its variations may use the serial connection while other probers such as the TEL and TSK probers and their variations may use the GP-IB protocol.

It should be noted that each prober and/or handler may require a variation in the interface 110. That is, each prober and/or handler may use slightly different forms of a common interface. For example, a first prober (e.g., TEL) may use the GP-IB protocol with a first set of settings while a second prober (e.g., TSK) may use the GP-IB protocol with a second set of settings. The different settings for the common connection type of the interface 110 may be adjustable. A user interface may be provided on the simulator 115 to enable the adjustments to the interface 110.

Figure 3:
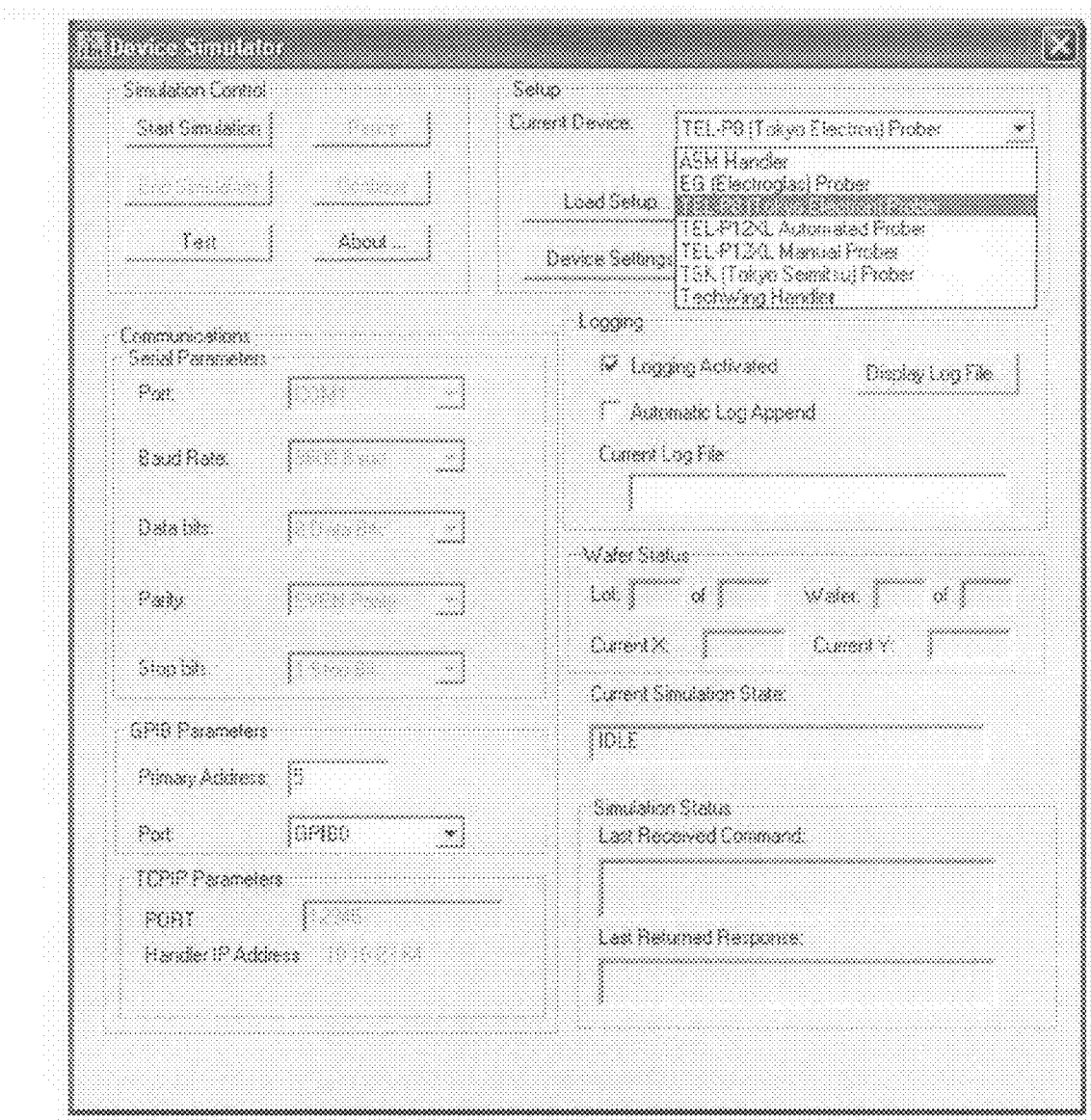
FIG. 3 shows a first user interface for the testing system of FIG. 1 according to an exemplary embodiment of the present invention.

The computing device in which the simulator 115 is installed thereon may include a display. The display may function in conjunction with a user interface. The user interface may enable a tester to use menu options for specifying a type of the device to be simulated. For example, a list box may be used to specify a class of the device (i.e., selection of a prober or handler). FIG. 3 shows a first user interface for the testing system 100 of FIG. 1 according to an exemplary embodiment of the present invention. Specifically, the first user interface is for the list menu. A following list box may be used to specify a specific device (e.g., selection of a type of prober). Upon selecting the device, a subsequent set of input entries may be shown on the display where the input entries correspond to the parameters of the simulation. FIG. 4 shows a second user interface for the testing system 100 of FIG. 1 according to an exemplary embodiment of the present invention. Specifically, the second user interface is the subsequent set of input entries for the parameters. An additional input entry may be provided so that a specific command or parameter for the simulated device may be entered. The parameters may also include a means to specify an error simulation. For example, a parameter may include offsetting a position of the wafer prober during the simulation. Furthermore, the parameters may include a means to adjust a timing of message traffic to enable approximation of a real device timing. In addition, the parameters may enable a full description of the device under test. For example, with a prober, parameters for the simulated wafer being tested may be described, thereby all step and test data sent back to the controller 105 may be used to approximate a real wafer test. This may include, for example, a reference die, spatial coordinates, optical character recognition (OCR) output, any off-wafer data needed to indicate legal open situations, wafer dimensions, touchdown dimensions for each test, cassette map, etc. The parameters for a particular simulation may be stored and may also be retrieved for duplicating the parameters for another simulation.

Figure 6:
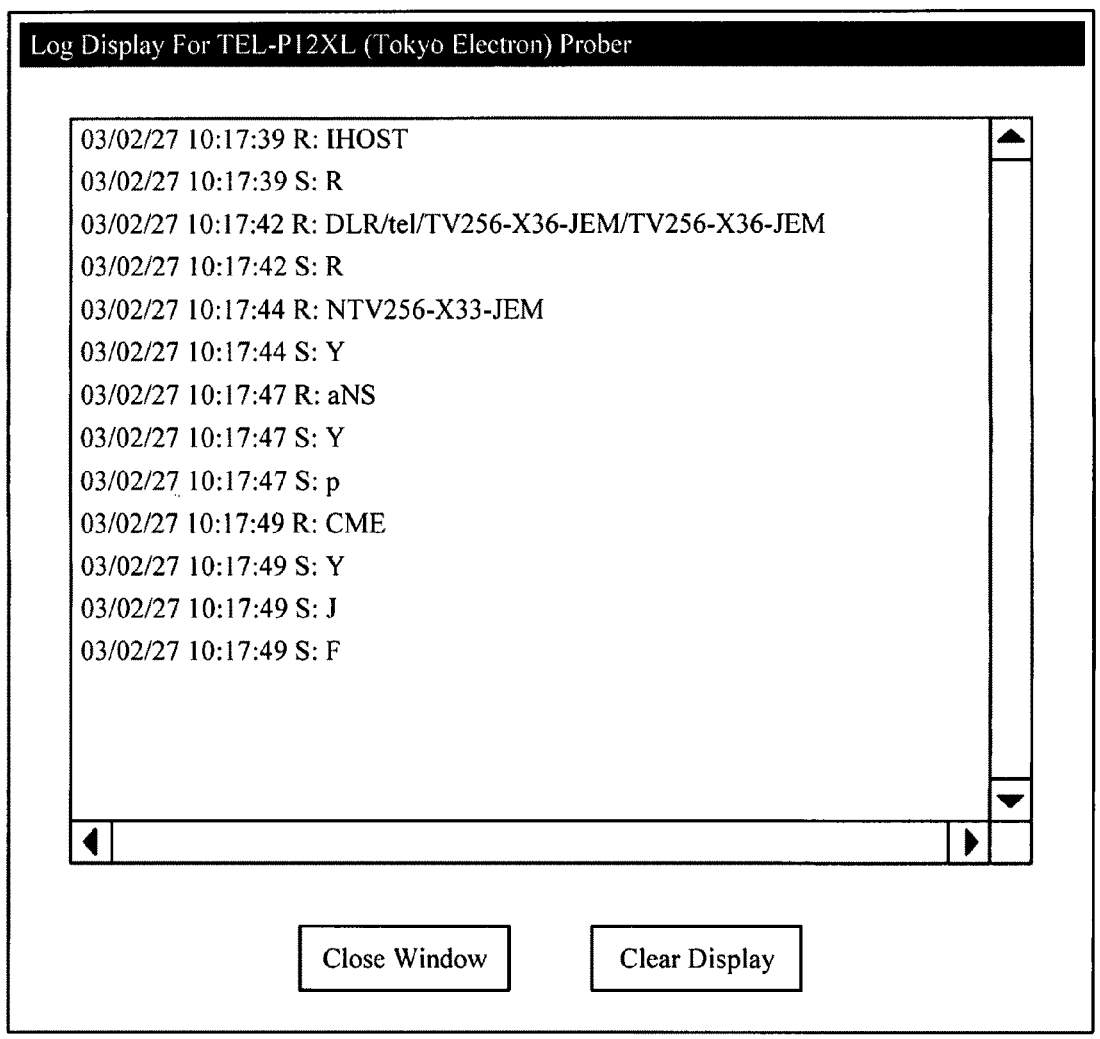
FIG. 6 shows a fourth user interface for the testing system of FIG. 1 according to an exemplary embodiment of the present invention.

At any time prior during the simulation (e.g., an initial step, after selecting the device, after specifying the parameters, upon running the simulation), the tester may use a logging capability that saves the input traffic from the controller 105 and/or the output traffic from the simulator 115 in the form of a log. FIG. 5 shows a third user interface for the testing system 100 of FIG. 1 according to an exemplary embodiment of the present invention. Specifically, the third user interface may be for the logging capability. The logging capability may also be set separately without consideration of running a simulation. For example, the logging capability may be a modifiable global setting for each simulation that is run. In this manner, the logging capability may be toggled on or off. In another embodiment, the tester may enter a number of simulations to be run. The simulator 115 may store a log for each simulation and the tester may then select which of the logs to permanently store while the other logs are deleted. The log of a simulation may additionally include data relating to communication problems encountered during a simulation. For example, when an input signal is received at a time when the simulated device is not prepared to receive the input signal, the communication problem is stored in the log. The logging capability may also enable a user to name a log file, save a log file under a new name, prompt a tester when a name for a log file already exists so that the log may be overwritten or renamed, etc. It should be noted that the logging capability being used at finite instances is only exemplary. The log may also be used to monitor and/or display the simulation in real time. FIG. 6 shows a fourth user interface for the testing system 100 of FIG. 1 according to an exemplary embodiment of the present invention. Specifically, the fifth user interface may be the real time display for the logging capability.

It should be noted that the simulator 115 may include a standard set of default parameters corresponding to each specified device. The default parameters may be provided by the programmer of the software for the simulator 115. The default parameters may also be set by the tester. Thus, if a tester is specifying the parameters for a simulation, an unentered parameter may be set to the default setting.

It should also be noted that the devices to be simulated above are only exemplary. Other devices and future devices may be added to the list menu presented to the user. An option may be provided for the user interface to add other devices. The added devices may become part of the list menu for the tester to select. Furthermore, default parameters and/or settings and other descriptions relating to the added device may be included when adding the device to the list of potential simulated devices.

The simulation of the specified device may be performed using a set of supported commands and supported responses for the simulated device. These commands and/or responses are activated upon specification of the device. A standard set of internal data structures may be used when support for a device is added to the simulator 115 to specify a set of corresponding commands and responses. For each command receivable from the controller 105, all the supported responses may be added to the data structures. The user interface may supply a means of showing all the supported commands by value and with a text description of the command. For each command, the user interface may show all the supported responses, and vice versa.

Furthermore, for each command, the user interface may allow either the selection of one of the responses each time the command is received or the selection of a file that contains a sequence of responses for that command. If a single response is selected and there is data associated therewith, an edit field may be presented to the tester to enter data to be sent with the response. In particular, this may be pertinent for error simulations, either by returning a response that indicates an error was encountered or by returning data that will invoke an error in the controller software. If a file is chosen, each subsequent receipt of the target command may cause the next response in the sequence to be sent back to the controller. Once the last response in the sequence is sent, the sequence may reset to the first response to provide a virtual looping capability.

In addition, the user interface may provide the tester a means of entering a delay value for each command to control the simulated timing of command execution. Because the exemplary embodiments of the present invention are for a simulation, commands and responses may be performed consecutively with no delay. Specifically, the simulation is not required to wait for a physical device to perform a command (e.g., positioning). The delay value may further provide the simulation with conditions as close to a physical device being used. There may also be a means to set a standard delay value for all message traffic.

The user interface may provide entering a description of the device under test (DUT). Specifically, a DUT description dialog box may be opened when selecting the option from the user interface. This may enable the tester to enter any relevant information for describing the device being tested (e.g., serial number, type of device, make, model, etc.). The box displayed may be dependent on the device being simulated due to the device tested by a handler may not be the same as a wafer being tested by a prober. In either case, information entered into the dialog box may be used by the simulator 115 to return the proper indexing and legal open information when necessary.

The user interface may provide at least two input keys for initiating and terminating a simulation. Upon specification of a device and corresponding parameters, an initiation key may be used to start the simulation. The initiation key may be device specific in that, for example, some probers may start by loading a wafer and informing the controller 105 that the process started while other probers wait for the controller 105 to activate the process (e.g., lot start, wafer load, etc.). A termination key may be used to end the simulation. The termination key may stop the simulator 115 from responding to any of the message traffic from the controller 105 and return the simulation process to an inactive state. It should be noted that the termination key may be used at any point during the simulation to, for example, preemptively stop the simulation, stop the simulation after a set of responses have been executed when the looping is activated, etc. It should also be noted that the termination key may be unnecessary as the simulation may include a run time, a number of executions for a set of commands/responses, etc. Thus, the simulation may automatically terminate upon performing the predetermined simulation parameters. Another input key may include a pause/continue key to allow the tester to temporarily stop a simulation. The first user interface for the testing system of FIG. 1 may include the at least two keys for controlling an initiation, a termination, a pausing, and a continuation of the simulation.

The simulator 115 may include a state machine for determining where the simulation is in the testing process. The state machine may provide a device command processing to respond appropriately if commands are received by the simulator 115 from the controller 105 out of sequence. For example, when a TEL prober is loading a new wafer and the "VF" or abort command is received, the prober is not in a proper state and the abort command is not recognized or processed at that time. Furthermore, this may be stored in the log indicating what, when, where, and why the error occurred.

Figure 2:
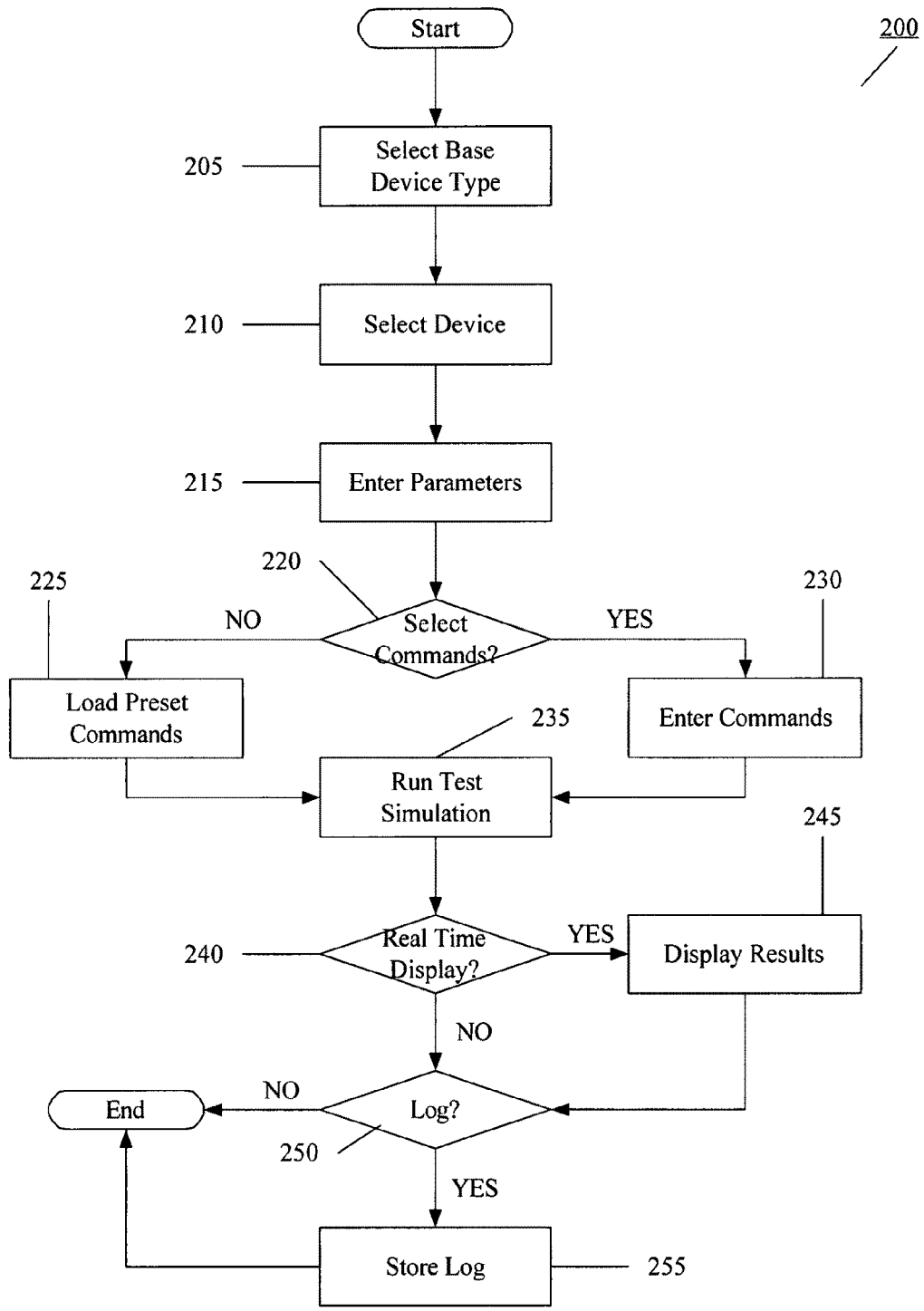
FIG. 2 shows a method for simulating a test according to an exemplary embodiment of the present invention.

FIG. 2 shows a method 200 for simulating a test according to an exemplary embodiment of the present invention. The method 200 describes steps to perform a simulation for testing a software of a controller for semiconductor flash memory wafer testing and semiconductor flash memory package testing without requiring a physical wafer prober and/or package handler. The method 200 may be used with the testing system 100 of FIG. 1. Thus, the method 200 will be described with reference to the components of the testing system 100.

In step 205, a base device type is selected. As described above, initially, a base device type such as prober or handler is selected. As illustrated in FIG. 3, the user interface may include a menu list of the base device types. Once the base device type is selected, in step 210, a specific device of that type is selected. For example, if prober was selected, the next selection may be an EG prober, a TEL prober, a TSK prober, any variation thereof, etc. The user interface including the menu list of FIG. 3 also illustrates this selection. Once the specific device is selected, in step 215, parameters of the simulation are entered. As illustrated in FIG. 4, the user interface may include input entries for the different parameters of the simulation.

In step 220, a determination is made whether commands are to be selected for the simulation. As discussed above, the simulator 115 may include a set of commands/responses to be executed for the simulation. Each simulation of the simulator 115 may be customizable so that the set of commands to be executed may be dynamic. Thus, if a set of commands relating to the specific device selected is to be used, the method 200 continues to step 225 where preset commands are loaded. If the commands are selected by the tester, the method 200 continues to step 230 where the commands are entered. In either case, the method 200 continues to step 235 where the test simulation is run. The simulation may be initiated using, for example, the first user interface of FIG. 3.

In step 240, a determination is made whether a real time display of the simulation is to be performed. As discussed above, the simulation may be paused and continued during the time of the simulation. The simulation may be paused and continued using, for example, the first user interface of FIG. 3. The pausing of the simulation may be done upon viewing the real time results of the simulation. Thus, if the real time display is to be performed, the method 200 continues to step 245 where the results are shown. The results may be shown using, for example, the fourth user interface of FIG. 6.

In step 250, a determination is made whether a log of the simulation is to be stored. If a log is to be stored, the method 200 continues to step 255 where the log is saved, for example, in a memory of the simulator 115 or the controller 105. The selection of whether to store the log may be done using, for example, the third user interface of FIG. 5. It should be noted that the logging capability being performed in the method 200 at steps 250-255 is only exemplary. As discussed above, the logging capability may be selected at any time prior to, during, and after the simulation.

The exemplary embodiments of the present invention provide testers with an advantage of being able to choose from a plurality of different probers and/or handlers without requiring a different software and/or hardware. Because the simulator is primarily software driven, addition of new probers/handlers and interfaces may be easily done. Furthermore, the simulator provides a fault insertion capability by allowing simulation responses to be read from a file sequentially. The simulator enables regression tests to be performed with even greater test coverage. The portability of the simulator also provides a convenient means of testing in troubleshooting matters in the field.

Those skilled in the art will understand that the above described exemplary embodiments may be implemented in any number of manners, including, as a separate software module, as a combination of hardware and software, etc. For example, the simulator may be a program containing lines of code that, when compiled, may be executed on a processor of a computing device.

It will be apparent to those skilled in the art that various modifications may be made in the present invention, without departing from the spirit or scope of the invention. Thus, it is intended that the present invention cover the modifications and variations of this invention provided they come within the scope of the appended claims and their equivalents.

What is claimed is:

1. A method for running a simulation, comprising:
   receiving a selection of a device, the device being one of a prober used in wafer testing and a handler used in package testing;
   receiving at least one parameter for a set of parameters for the simulation; and
   running the simulation using the set of parameters, to simulate the device being present when the device is not present, the simulated device executing commands received from a controller, the commands being executed as if the device were present, and results from the simulation indicating a performance of the controller.

2. The method of claim 1, wherein receiving the selection of the device further comprises receiving a selection of a base device type and receiving a selection of a specific device of the base device type.

3. The method of claim 1, wherein the at least one parameter includes a fault insertion.

4. The method of claim 1, wherein the simulation is one of an error-free simulation and an error simulation.

5. The method of claim 1, wherein running the simulation further includes executing responses relating to the device.

6. The method of claim 1, further comprising:
   receiving a time delay associated with each of the commands to perform the simulation as if the device were present.

7. The method of claim 1, further comprising:
   displaying the results in a real-time display as the results are generated.

8. The method of claim 1, further comprising:
   creating a log of the simulation, the log including the commands and the results of the simulation.

9. The method of claim 1, further comprising:
   receiving a selection of an interface that corresponds to the device that is specified.

10. The method of claim 9, wherein the interface is one of a serial connection, a GP-IB protocol, and a LAN connection.

11. The method of claim 1, further comprising:
    setting remaining ones of the set of parameters to a default setting relating to the specified device.

12. A testing system, comprising:
    a controller transmitting commands; and
    a simulator running a simulation by executing the commands received from the controller as if a device not present were present, the simulator receiving data specifying the device, the device being one of a prober used in wafer testing and a handler used in package testing, the simulator receiving at least one parameter for a set of parameters for the simulation, and the simulator generating results from the simulation indicating a performance of the controller.

13. The system of claim 12, wherein the at least one parameter includes a fault insertion.

14. The system of claim 12, wherein the simulation is one of an error-free simulation and an error simulation.

15. The system of claim 12, wherein the simulator executes responses relating to the device.

16. The system of claim 12, wherein the simulator executes a time delay associated with each of the commands to perform the simulation as if the device were present.

17. The system of claim 12, further comprising:
    a display displaying the results in real-time as the results are generated.

18. The system of claim 12, wherein the simulator includes a logger creating a log of the simulation, the log including the commands and the results of the simulation.

19. The system of claim 12, wherein the simulator simulates an interface corresponding to the device that is specified.

20. The system of claim 19, wherein the interface is one of a serial connection, a GP-IB protocol, and a LAN connection.

21. The system of claim 12, wherein the simulator sets remaining ones of the set of parameters to a default setting relating to the specified device.

22. A non-transitory computer readable storage medium including a set of instructions executable by a processor, the set of instructions operable to cause the processor to:
    receive a selection of a device, the device being one of a prober used in wafer testing and a handler used in package testing;

receive at least one parameter for a set of parameters for the simulation; and run the simulation using the set of parameters, to simulate the device being present when the device is not present, by executing commands to be performed as if the device were present, the simulation receiving the commands from a controller, and results from the simulation indicating a performance of the controller.

* * * * *